United States Patent [19]

Hasegawa

[11] Patent Number: 5,554,823
[45] Date of Patent: Sep. 10, 1996

[54] PACKAGING DEVICE AND ITS MANUFACTURING METHOD

[75] Inventor: Miki Hasegawa, Kyoto, Japan

[73] Assignee: Rohm Co., Ltd., Kyoto, Japan

[21] Appl. No.: 996,336

[22] Filed: Dec. 23, 1992

[30] Foreign Application Priority Data

Dec. 27, 1991 [JP] Japan ................................. 3-360057

[51] Int. Cl.⁶ ................................................. H01L 23/02
[52] U.S. Cl. ......................... 174/52.4; 361/763; 361/776
[58] Field of Search .................................. 361/763, 772, 361/773, 774, 776; 257/696, 669, 676, 674, 692, 693, 694, 695, 784, 735, 736; 174/52.4, 52.3

[56] References Cited

U.S. PATENT DOCUMENTS

| | | | |
|---|---|---|---|
| 4,660,127 | 4/1987 | Gunter | 361/433 |
| 4,703,393 | 10/1987 | Tamamoto et al. | 361/405 |
| 4,794,446 | 12/1988 | Hammo | 357/74 |
| 4,890,154 | 12/1989 | Sahauian | 357/74 |
| 5,107,324 | 4/1992 | Iwahara et al. | 174/52.5 |
| 5,177,674 | 1/1993 | Sugisaki | 361/534 |
| 5,281,852 | 1/1994 | Normington | 257/685 |
| 5,410,445 | 4/1995 | Taue | 361/539 |
| 5,475,259 | 12/1995 | Kosai et al. | 257/692 |

FOREIGN PATENT DOCUMENTS 3116767  5/1991  Japan .................................. 257/669

OTHER PUBLICATIONS

Patent Abstracts of Japan, vol. 13, No. 551, Dec. 8, 1989.
Patent Abstracts of Japan, vol. 13, No. 509, Nov. 15, 1989.
Patent Abstracts of Japan, vol. 9, No. 147, Jun. 21, 1985.
Patent Abstracts of Japan, vol. 12, No. 481, Dec. 15, 1988.

*Primary Examiner*—Laura Thomas
*Assistant Examiner*—Christopher Horgan
*Attorney, Agent, or Firm*—Nikaido, Marmelstein, Murray & Oram LLP

[57] ABSTRACT

A tantalum capacitor chip and lead terminals respectively connected to two electrodes of the chip are molded in resin. A portion of the lead terminal, not molded in the resin is bent at a tip side and at a base side. The resin is provided with a structure in which its upper half is longer than its lower half at both sides. The base side portion of the portion not molded in the resin, of each of the lead terminals is curved downward with a predetermined radius of curvature, and an inwardly bent portion is formed on the tip side of the base side curved portion of the protruding portion.

3 Claims, 4 Drawing Sheets

PACKAGING DEVICE AND ITS MANUFACTURING METHOD

BACKGROUND OF THE INVENTION

1. Field of the Invention

The present invention relates to a packaging device and a method of manufacturing the packaging device, such as a chip tantalum capacitor, in which the base and tip sides of a portion of a lead terminal, not molded in resin are bent nearly along an external surface of the resin.

2. Description of the Prior Art

FIG. 1 shows a package structure of a conventional tantalum capacitor T'. Numeral 10 represents a chip of the capacitor T'. As conventionally known, an electrode is formed at each of an external surface and a central portion of the chip 10. To the two electrodes, lead terminals 11 and 12 are connected, respectively. The connection of the electrode provided at the external surface of the chip 10 to the lead terminal 11 is made by soldering one end of the lead terminal 11 directly to the electrode surface. The connection of the electrode provided at the central portion of the chip 10 to the lead terminal 12 is made through a tantalum wire 13 protruding from the electrode.

The chip 10 whose electrodes are connected to the lead terminals 11 and 12, respectively, is molded in a resin 14 together with the tantalum wire 13 and one end portion of each of the lead terminals 11 and 12. Conventionally, the outline of the cross section of the resin 14 is, schematically describing, like a pair of vertically symmetrical trapezoids connected to each other. Each of the lead terminals 11 and 12 horizontally protrudes from a portion corresponding to an edge of the connection portion of the trapezoids.

In assembling the tantalum capacitor T' having such a structure onto a circuit board as an element of an electronic circuit, portions 11A and 12A (hereinafter referred to as terminal out-of-resin portions) of the lead terminals 11 and 12 which portions are not molded in the resin 14 are L-shapedly bent nearly along an external surface of the resin 14. These portions serve as connection portions to the circuit board.

FIGS. 2A to 2C sequentially show a conventional process of forming bent portions on the terminal out-of-resin portions 11A and 12A. As shown in FIG. 2A, the terminal out-of-resin portions 11A and 12A protrude straight at the point of time when base portions of the lead terminals 11 and 12 are molded in resin.

To form the bent portions on the terminal out-of-resin portions 11A and 12A, a forming roller FR' made of tool steel abuts against a predetermined position of the terminal out-of-resin portions 11A and 12A when it moves so as to draw a predetermined locus while rotating in the vicinity of the terminal out-of-resin portions 11A and 12A fixed by chucking the upper and lower surfaces of the resin 14 with an appropriate chucking apparatus (not shown), and it forcibly bends the abutted portion along the locus.

That is, the terminal out-of-resin portions 11A and 12A protruding from both end surfaces of the resin 14 are formed into an almost L shape along the external surface of the resin 14 by nearly perpendicularly bending their base portions 11a and 12a downward and further by nearly perpendicularly bending predetermined portions 11b and 12b located on the tip side of the base side bent portions 11a and 12a inward. In the forming process, first, as a primary process, tire tip side bent portions 11b and 12b of the terminal out-of-resin portions 11A and 12A are formed as shown in FIG. 2B.

The locus of the forming roller FR' in the primary process is not shown. When the roller FR' passes through a position a predetermined distance away from the end surface of the resin 14, the tip side portions of the terminal out-of-resin portions 11A and 12A abut against the roller FR' and are forcibly, perpendicularly bent downward as the roller FR' moves, thereby forming the tip side bent portions 11b and 12b. A portion of the terminal out-of-resin portion 11A between the end surface of the resin 14 and the tip side bent portion 11b and a portion of the terminal out-of-resin portion 12A between the end surface of the resin 14 and the tip side bent portion 12b are supported on flat surfaces, respectively.

Then, as a secondary process, the base side bent portions 11a and 12a of the terminal out-of-resin portions 11A and 12A are formed as shown in FIG. 2C. In this secondary process, the forming roller FR' draws a locus L' passing in the vicinity of the end surface of the resin 14, and in a process similar to the primary process, it nearly perpendicularly bends the base portions of the terminal out-of-resin portions 11A and 12A downward with the end surface of the resin 14 as a fulcrum S1, thereby forming the base side bent portions 11a and 12a. Conventionally, the base side portions 11a and 12a are bent in a condition where edges are formed since an admission angle θ1 of the forming roller FR' is set to approximately 80° and the distance between the fulcrum S1 and the forming roller FR' are set to be extremely small.

In connecting the lead terminals 11 and 12 to an electrical connection on a circuit board by soldering, the tantalum capacitor T' of such a structure is pressed on the upper surface of the resin 14. Moreover, there are occasions when a similar pressing force acts from the outside after the connection to the circuit board is completed. In such cases, the pressing force is concentrated on the base side bent portions 11a and 12a of the terminal out-of-resin portions 11A and 12A.

However, in a case where the base side bent portions 11a and 12a of the terminal out,of-resin portions 11A and 12A are nearly perpendicularly bent so as to constitute edges like the above-described prior art, since a stress is concentrated on the bent portions 11a and 12a when the pressing force is applied, cracks are apt to be generated. Because of this, under a condition where the package has been assembled on a circuit board, there is a strong possibility that the package breaks at the base side bent portions 11a and 12a due to a deteriorated mechanical strength of the lead terminals 11 and 12 at the portions 11a and 12a. There is also a strong possibility that the package breaks due to an external force which acts after the assembly is completed. If the lead terminals break, it will be impossible for the capacitor to perform its function.

SUMMARY OF THE INVENTION

An object of the present invention is to provide a packaging device and its manufacturing method in which the mechanical strength of a portion of a lead terminal, not molded in resin, that is, a portion of a terminal out-of-resin portion, bent downward is improved.

To achieve the above-mentioned object, an electric circuit device package of the present invention is provided with an electric circuit device, a plurality of lead terminals whose one ends are connected to electrodes of the electric circuit device, respectively, and a resin for molding the electric circuit and a one-end-side portion of each of the plurality of lead terminals. The remainder of each of the leads not encapsulated in the resin protrudes out of an end surface of the resin, and is curved downward. Each of the leads curved downward from a lower side of an upper half of the resin in an arcuate manner with a predetermined radius of curvature. The predetermined radius of curvature of each lead terminal is 0.06 mm to 1.0 mm. An inwardly bent portion is formed on a second end of each of the plurality of lead terminals. The inwardly bent portions have a smaller radius of curvature than the predetermined radius of curvature.

With such features, since the base side portion of the portion of the lead terminal, not molded in resin is curved, when a pressing force is applied to the device, a stress caused at the lead terminals are nearly uniformly dispersed on the entire curved portion. As a result, the mechanical strength of the lead terminals improves and cracks are hardly generated.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

Figure 3:
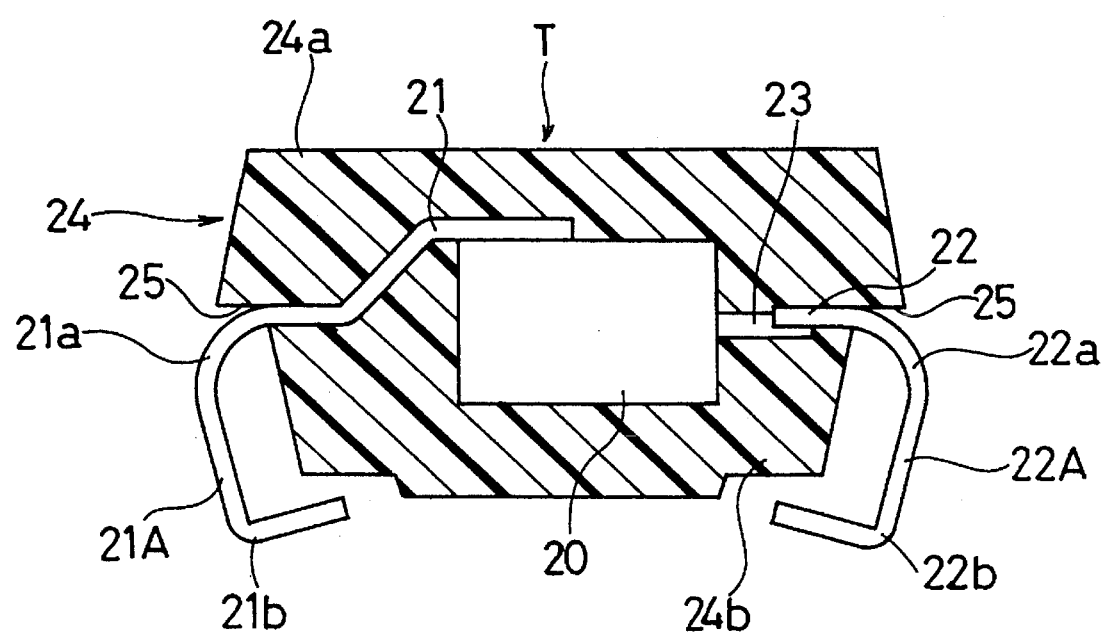
FIG. 3 is a cross-sectional view showing an example of a package structure of a tantalum capacitor embodying the present invention.

FIG. 3 shows a package structure of a tantalum capacitor T embodying the present invention. Numeral 20 represents a chip of the capacitor T. Two electrodes respectively formed at the external surface and a central portion of the chip 20 are connected to lead terminals 21 and 22, respectively. The connection of the electrodes provided at the external surface to the lead terminal 21 is made by soldering the base portion of the lead terminal 21 directly to the electrode surface. The connection of the electrodes provided at the central portion and the lead terminal 22 is made through a tantalum wire 23 protruding out of the electrode.

Figure 1:
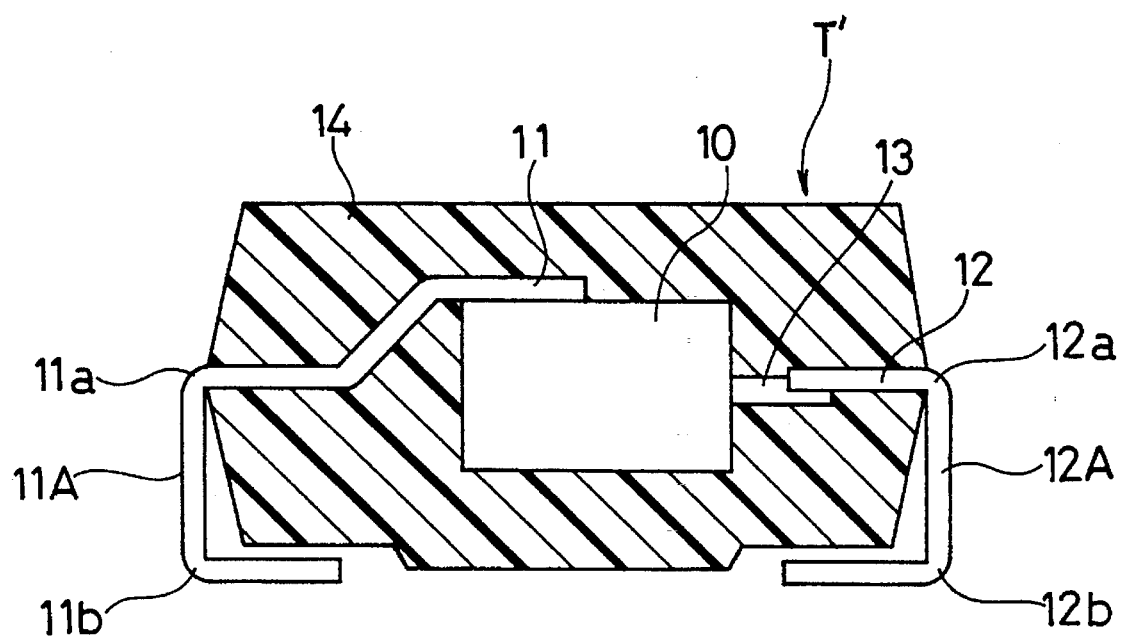
FIG. 1 is a cross-sectional view showing an example of a package structure of a conventional tantalum capacitor.
Figure 2A:
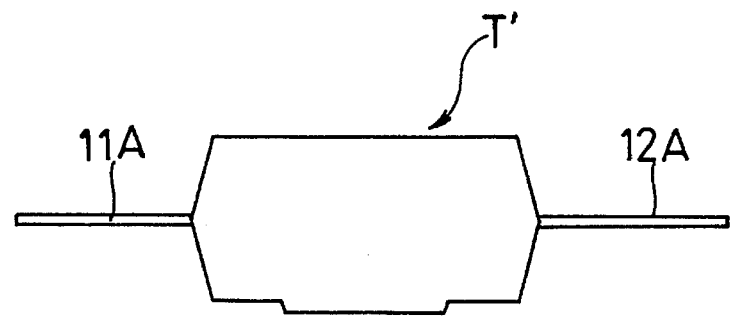
FIGS. 2A to 2C are schematic front views sequentially showing a forming process of lead terminals of the conventional tantalum capacitor of FIG. 1.
Figure 2B:
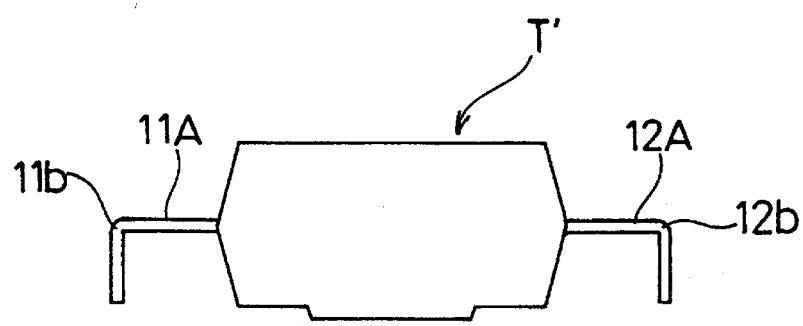
Figure 2C:
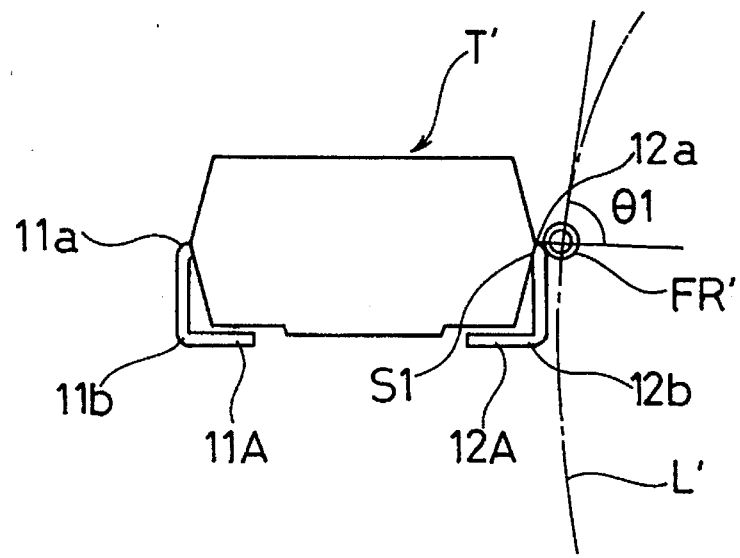

The chip 20 whose electrodes .are connected to the lead terminals 21 and 22, respectively, is molded in a resin 24 together with the tantalum wire 23 and one end portion of each of the lead terminals 21 and 22. In this embodiment, the molding configuration of the chip 20 by the resin 24 is common to the conventional one shown in FIG. 1 in that the external shape of the resin 24 is constituted by an upper half 24a having a trapezoidal cross section and a lower half 24b having an inverse trapezoidal cross section which are connected to each other, but it is largely different from the conventional one in that the lower side of the upper half 24a is longer than the upper side of the lower half 24b at both sides.

In assembling the tantalum capacitor T of such a structure of the present invention on a circuit board as an element of an electric circuit, portions 21A and 22A (hereinafter referred to as terminal out-of-resin portions) of the lead terminals 21 and 22 which portions are not molded in resin function as connection portions to the circuit board. The terminal out-of-resin portions 21A and 22A are formed into a condition where their base portions in the vicinity of end surfaces of the resin 24 are bent downward with a predetermined radius of curvature, and further into a condition where portions located on the tip side of the base side curved portions are bent inward.

Since the base side curved portions 21a and 22a of the terminal out-of-resin portions 21A and 22A are formed to be curved as described above, when a pressing force applied to the upper surface of the resin 24 in connecting the lead terminals 21 and 22 to an electrical:connection on a circuit board, or a pressing force applied from the outside after the connection to the circuit board is completed acts on the base portions 21a and 22a, a stress caused at the base portions 21a and 22a is nearly uniformly dispersed on the entire curved structures and is not concentrated. Consequently, the generation of cracks is prevented as much as possible. Thus, the possibility of breakage of the base portions 21a and 22a of the terminal out-of-resin portion 21A and 22A is reduced.

Figure 4A:
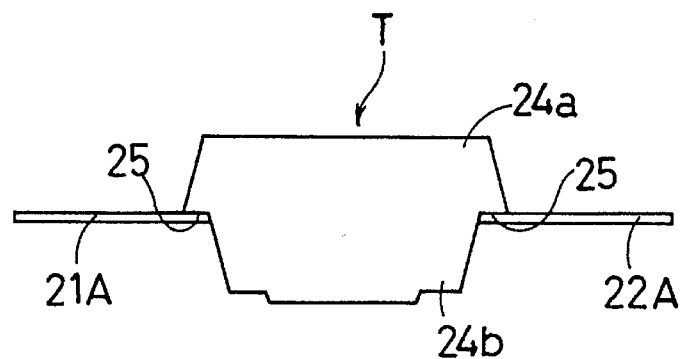
FIGS. 4A to 4C are schematic front views sequentially showing a forming process of lead terminals of the tantalum capacitor of FIG. 3.
Figure 4B:
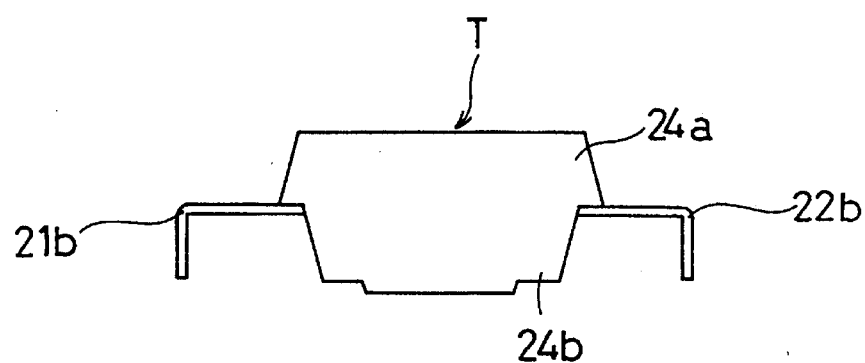
Figure 4C:
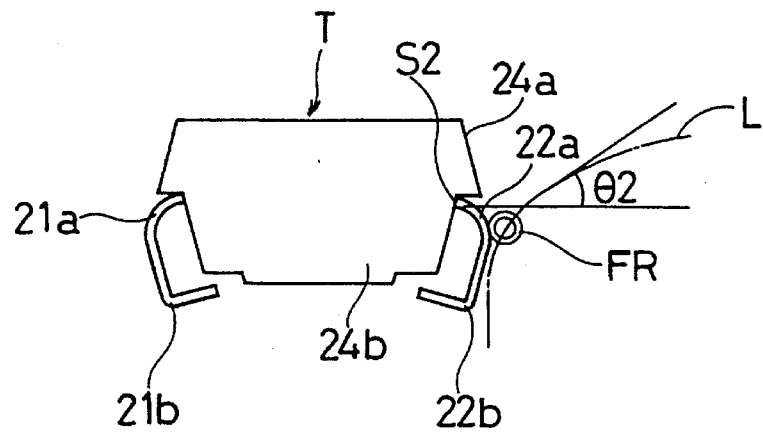

FIGS. 4A to 4C show a process of forming bent portions on the terminal out-of-resin portions 21A and 22A in this embodiment. As shown in FIG. 4A, at the point of time when the chip 20 is molded in resin 24, the lead terminals 21 and 22 horizontally protrude out of the connection portion between the upper half 24a and the lower half 24b of the resin 24 from the lower half 24b side. The base portions of the terminal out-of-resin portions 21A and 22A are nearly in contact with lower surfaces 25 of the upper half 24a of the resin 24 which surfaces protrude like a visor.

To form the bent portions on the terminal out-of-resin portions 21A and 22A, similarly to the conventional process, a forming roller FR made of tool steel abuts against predetermined positions of the terminal out-of-resin portions 21A and 22A when it moves so as to draw a predetermined locus while rotating in the vicinity of the terminal out-of-resin portions 21A and 22A fixed by chucking the upper and lower surfaces of the resin 24 with an appropriate chucking apparatus (not shown), and it forcibly bends the abutted portion along the locus.

That is, the terminal out-of-resin portions 21A and 22A protruding from both end surfaces of the resin 24 is bent so that their base portion are curved downward and that predetermined portions 21b and 22b located on the tip side of the base side curved portions 21a and 22a are nearly perpendicularly bent inward. In the forming process, first, as a primary process, the tip side bent portions 21b and 22b of the terminal out-of-resin portions 21A and 22A are formed as shown in FIG. 4B.

In this primary process, a portion of the terminal out-of-resin portion 21A between the end surface of the resin 24 and the tip side bent portion 21b and a portion of the terminal out-of-resin portion 22A between the end surface of the resin 24 and the tip side bent portion 22b are supported on flat surfaces of supporting members (not shown), respectively. When the forming roller FR, whose locus is not shown, passes through a position a predetermined distance away from the end surface of the resin 24, the tip side portions of the terminal out-of-resin portions 21A and 22A abut against the roller FR and are forcibly, perpendicularly bent downward as the roller FR moves, thereby forming the tip side bent portions 21b and 22b.

Then, as a secondary process, the base side curved portions 21a and 22a of the terminal out-of-resin portions 21A and 22A are formed as shown in FIG. 4C. In this secondary process, the forming roller FR draws a locus L passing in the vicinity of the end surface of the resin 24. In this embodiment, an admission angle θ2 of the forming roller FR is set to 30°, and therefore the forming roller FR is admitted at a fairly obtuse angle compared to the conventional admission angle of 80°. As a consequence, abutment positions of the roller FR and the terminal out-of-resin portions 21A and 22A are outer compared to the conventional one.

On the contrary, since the width of the lower half 24b of the resin 24 is narrower than that of the upper half 24a, a bending fulcrum S2 of the terminal out-of-resin portions 21A and 22A is inner compared to the conventional one. Consequently, since the distance between the fulcrum S2 and the connection portion between the terminal out-of-resin portions 21A and 22A and the forming roller FR is fairly large compared to the conventional one, the base portions of the terminal out-of-resin portions 21A and 22A are forcibly bent in an arc form with the fulcrum S2 nearly as the center as the forming roller FR moves. In this case, it is desirable that the radius of curvature of the base side curved portions 21a and 22a be approximately 0.06 to 1.0 mm.

Regarding the base side curved portions 21a and 22a of the tantalum capacitor T of this embodiment and the base side bent portions 11a and 12a of the previously-described conventional tantalum capacitor T', a so-called bending test was carried out in which the portions were repeatedly bent and straightened until they completely broke. When an action of straightening and bending is counted as one time, in this embodiment, it took 1.5 to 2 times until the portions completely broke. On the contrary, in the conventional capacitor T', the result was 0.5 to 1 time. From the results of the bending test, it is understood that the strength is nearly doubled.

As described above, according to the present invention, in assembling an electric circuit device such as a tantalum capacitor, since the base sides of portions of the lead terminal 21 and 22 which portions are not molded in resin are curved with a predetermined radius of curvature in bending the base and tip sides of the out-of-resin portions, a pressing force applied to the upper surface of the resin 24 in connecting the lead terminals 21 and 22 to an electrical connection on a circuit board or a pressing force applied from the outside after the connection to the circuit board is completed is nearly uniformly dispersed on the entire base side curved portions 21a and 22a and is not concentrated, thereby improving the mechanical strength of the curved portions 21a and 22a. As a result, the possibility of breakage of the base portions 21a and 22a of the terminal out-of-resin portions 21A and 22A which breakage may be caused at the time of the connection to a circuit board or after the connection is completed is reduced. Thus, the assembly yield is improved.

Obviously, many modifications and variations of the present invention are possible in light of the above teachings. It is therefore to be understood that within the scope of the appended claims, the invention may be practiced other than as specifically described.

What is claimed is:

1. A packaging device comprising:

an electric circuit device;

a plurality of lead terminals, each of said lead terminals having two ends with a first of said two ends of each of said lead terminals being connected to the electric circuit device; and a resin for encapsulating the electric circuit device and said one of said ends of each of the plurality of lead terminals, wherein a remainder of each of said leads not encapsulated in the resin protrudes out of an end surface of the resin and is curved downward, each of said leads curving downward from a lower side of an upper half of the resin in an arcuate manner with a predetermined radius of curvature, wherein the predetermined radius of curvature of each lead terminal is 0.06 mm to 1.0 mm, and an inwardly bent portion is formed on a second end of each of said plurality of lead terminals, said inwardly bent portions having a smaller radius of curvature than said predetermined radius of curvature, and wherein an outermost end of the inwardly bent portion is located inward from an outermost point of the predetermined radius of curvature.

2. A packaging device according to claim 1, wherein the resin is formed into a structure in which a lower side of the upper half is longer than an upper side of a lower half at both sides and the lead terminals protrude out of a lower half side of a connection portion between the upper and lower halves of the resin.

3. A packaging device according to claim 1, wherein the electric circuit device is a tantalum capacitor chip.

\* \* \* \* \*